US008795556B2

(12) United States Patent
Lin

(10) Patent No.: US 8,795,556 B2
(45) Date of Patent: Aug. 5, 2014

(54) SELF-ALIGNED PERMANENT ON-CHIP INTERCONNECT STRUCTURE FORMED BY PITCH SPLITTING

(75) Inventor: Qinghuang Lin, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/454,723

(22) Filed: Apr. 24, 2012

(65) Prior Publication Data
US 2012/0205818 A1    Aug. 16, 2012

Related U.S. Application Data

(62) Division of application No. 12/851,206, filed on Aug. 5, 2010, now Pat. No. 8,232,198.

(51) Int. Cl.
*C09K 5/00* (2006.01)
*G03F 7/095* (2006.01)
*G03F 7/075* (2006.01)
*H01L 21/3105* (2006.01)
*H01L 21/768* (2006.01)
*H01L 21/027* (2006.01)
*G03F 7/004* (2006.01)
*H01L 21/31* (2006.01)
*G03F 7/039* (2006.01)
*H01L 21/02* (2006.01)
*H01L 23/532* (2006.01)
*G03F 7/038* (2006.01)

(52) U.S. Cl.
CPC .......... *H01L 23/53295* (2013.01); *G03F 7/095* (2013.01); *G03F 7/0757* (2013.01); *H01L 21/3105* (2013.01); *H01L 21/76802* (2013.01); *H01L 21/0276* (2013.01); *G03F 7/0045* (2013.01); *H01L 2924/12044* (2013.01); *H01L 21/31* (2013.01); *G03F 7/0392* (2013.01); *H01L 21/02318* (2013.01); *H01L 21/02126* (2013.01); *H01L 21/02274* (2013.01); *H01L 21/02282* (2013.01); *H01L 23/5329* (2013.01); *H01L 21/76828* (2013.01); *H01L 21/76826*
(2013.01); *H01L 21/02345* (2013.01); *H01L 2221/1031* (2013.01); *H01L 21/76825* (2013.01); *G03F 7/0382* (2013.01); *H01L 21/76807* (2013.01)
USPC ............................ 252/570; 252/571; 438/637

(58) Field of Classification Search
None
See application file for complete search history.

(56) References Cited

U.S. PATENT DOCUMENTS 4,371,605 A    2/1983  Renner
4,808,545 A    2/1989  Balasubramanyam et al.
(Continued)

FOREIGN PATENT DOCUMENTS

CA    1204547    5/1986
JP    01293339   11/1989

OTHER PUBLICATIONS

Holmes, S. J., et al., "Edge lithography as a means of extending the limits of optical and nonoptical lithographic resolution" Part of the SPIE Conference on Advances in Resist Technology and Processing XVI, Mar. 1999, SPIE vol. 3678, pp. 348-357.
(Continued)

*Primary Examiner* — Necholus Ogden, Jr.
(74) *Attorney, Agent, or Firm* — Scully, Scott, Murphy & Presser, P.C.; Louis J. Percello, Esq.

(57) ABSTRACT

A hybrid photo-patternable dielectric material is provided that has dual-tone properties with a parabola like dissolution response to radiation. In one embodiment, the hybrid photo-patternable dielectric material includes a composition of at least one positive-tone component including a positive-tone polymer, positive-tone copolymer, or blends of positive-tone polymers and/or positive-tone copolymers having one or more acid sensitive positive-tone functional groups; at least one negative-tone component including a negative-tone polymer, negative-tone copolymer, or blends of negative-tone polymers and/or negative-tone copolymers having one or more acid sensitive negative-tone functional groups; at least one photoacid generator; and at least one solvent that is compatible with the positive-tone and negative-tone components.

19 Claims, 7 Drawing Sheets

(56) References Cited

U.S. PATENT DOCUMENTS

| | | |
|---|---|---|
| 5,651,857 A | 7/1997 | Cronin et al. |
| 5,795,830 A | 8/1998 | Cronin et al. |
| 5,886,102 A | 3/1999 | Sinta et al. |
| 5,939,236 A | 8/1999 | Pavelchek et al. |
| 5,976,768 A | 11/1999 | Brown et al. |
| 5,981,148 A | 11/1999 | Brown et al. |
| 6,007,968 A | 12/1999 | Furukawa et al. |
| 6,014,422 A | 1/2000 | Boyd et al. |
| 6,087,064 A | 7/2000 | Lin et al. |
| 6,093,508 A | 7/2000 | Cote |
| 6,114,082 A | 9/2000 | Hakey et al. |
| 6,150,256 A | 11/2000 | Furukawa et al. |
| 6,184,041 B1 | 2/2001 | Furukawa et al. |
| 6,194,268 B1 | 2/2001 | Furukawa et al. |
| 6,200,726 B1 | 3/2001 | Chen et al. |
| 6,221,562 B1 | 4/2001 | Boyd et al. |
| 6,245,488 B1 | 6/2001 | Furukawa et al. |
| 6,284,439 B1 | 9/2001 | Holmes et al. |
| 6,313,492 B1 | 11/2001 | Hakey et al. |
| 6,338,934 B1 | 1/2002 | Chen et al. |
| 6,440,635 B1 | 8/2002 | Holmes et al. |
| 6,649,531 B2 | 11/2003 | Cote et al. |
| 7,030,031 B2 | 4/2006 | Wille et al. |
| 7,041,748 B2 | 5/2006 | Lin et al. |
| 7,056,840 B2 | 6/2006 | Miller et al. |
| 7,265,013 B2 | 9/2007 | Furukawa et al. |
| 7,306,853 B2 | 12/2007 | Lin et al. |
| 7,585,614 B2 | 9/2009 | Furukawa et al. |
| 7,709,370 B2 | 5/2010 | Allen et al. |
| 2001/0021577 A1 | 9/2001 | Brown et al. |
| 2001/0054766 A1 | 12/2001 | Dirahoui et al. |
| 2004/0266201 A1 | 12/2004 | Wille et al. |
| 2005/0009305 A1 | 1/2005 | Anderson et al. |
| 2007/0099416 A1 | 5/2007 | Furukawa et al. |
| 2007/0166981 A1 | 7/2007 | Furukawa et al. |
| 2008/0142995 A1 | 6/2008 | Furukawa et al. |
| 2008/0187731 A1 | 8/2008 | Allen et al. |
| 2008/0286467 A1* | 11/2008 | Allen et al. ............ 427/259 |
| 2009/0079075 A1 | 3/2009 | Lin et al. |
| 2009/0079076 A1 | 3/2009 | Lin et al. |
| 2009/0081418 A1 | 3/2009 | Allen et al. |
| 2009/0233226 A1 | 9/2009 | Allen et al. |
| 2009/0291389 A1 | 11/2009 | Allen et al. |
| 2010/0009131 A1 | 1/2010 | Basker et al. |
| 2010/0028801 A1 | 2/2010 | Holmes et al. |
| 2011/0074044 A1 | 3/2011 | Lin et al. |

OTHER PUBLICATIONS

Gu, X., et al., "Photobase Generator Assisted Pitch Division", Advances in Resist Materials and Processing Technology XSVII, Conference Date: Monday Feb. 22, 2010, Proc. of SPIE, vol. 7639.

\* cited by examiner

ND STRUCTURE FORMED BY
SELF-ALIGNED PERMANENT ON-CHIP INTERCONNECT STRUCTURE FORMED BY PITCH SPLITTING

CROSS REFERENCE TO RELATED APPLICATION

This application is a divisional of U.S. patent application Ser. No. 12/851,206, filed Aug. 5, 2010 the entire content and disclosure of which is incorporated herein by reference.

FIELD OF THE INVENTION

The present disclosure relates to a semiconductor interconnect structure and a method of fabricating the same. More specifically, the present disclosure relates to a method of forming a self-aligned permanent interconnect structure in which a single-exposure-no-etch, self-aligned pitch splitting technique and a hybrid photo-patternable dielectric (HPPD) material are employed.

BACKGROUND

Optical lithography has been the workhorse to continuously shrink (or scale) semiconductor devices and their related interconnect structures. Traditional scaling by optical lithography has been achieved with one single exposure mostly by reduction in the wavelength of the light sources, new tool design (higher numerical aperture or NA), improved lithographic materials or a combination thereof. Recently, multiple patterning, particularly double patterning techniques, where one particular level of circuitry is patterned by exposing the wafer to a light source using two mask sets, has become increasingly necessary to maintain the pace of scaling at 193 nm optical wavelength. Typical double patterning (or pitch splitting) techniques, also referred to as double-exposure, double-etch schemes, require a lithographic imaging step, followed by a dry reactive ion etch (RIE) step into a sacrificial hardmask, followed by a second lithographic step, and yet a second RIE step into the hardmask. Finally, the double patterned images in the hardmask are transferred to the underlying substrate.

An improvement over this double patterning scheme is referred to as a double-exposure, single-etch scheme. The double-exposure, single-etch scheme achieves improved resolution by two independent exposures to form a double patterned image in a single patterning film stack and thereafter the double patterned image is transferred into the underlying substrate utilizing a single etch. This double-exposure, single-etch process scheme is as follows: A first pattern is formed into a first photoresist film by a high-resolution lithographic processes known in the art. Next, a second photoresist is coated directly on top of the first pattern. The coating of the second photoresist does not degrade the first pattern since a proper solvent for the second photoresist is employed or an image stabilization process to treat the first pattern such as, for example, thermal cure, ultraviolet cure, or surface coating, is employed. A second pattern is then formed in the second photoresist to achieve pitch splitting and thus higher resolution. Finally, an integrated reactive ion etch is performed in which both the first and second photoresist patterns are transferred into the underlying film stack.

The above mentioned double patterning scheme necessitates a significant increase in complexity, additional materials and tools, and the attendant increased manufacturing costs compared with a single exposure technique. Furthermore, the aforementioned double patterning scheme requires precise placement of the second exposure over the patterns formed by the first exposure. Any imperfect placement, or mis-alignment or overlay error, can cause degradation in performance or reliability or both of the resultant computer chips. Such mis-alignment is due to the limitation of the lithographic tool employed or processing errors.

The present disclosure the problems associated with prior art double patterning and double-exposure, single etch patterning schemes with a single-exposure, no-etch, self-aligned pitch splitting process using a hybrid photo-patternable dielectric material.

SUMMARY

In this disclosure, a single-exposure-no-etch, self-aligned pitch splitting process using a hybrid photo-patternable dielectric material is employed to provide a self-aligned permanent on-chip interconnect structure. The process of the present application can reduce the fabrication steps, materials and tools as well as costs of fabricating an interconnect structure. The disclosed process also improves resolution with just one exposure, compared with two exposures of traditional double patterning, using a single-exposure-no-etch, self-aligned pitch splitting process with a hybrid photo-patternable dielectric material. The hybrid photo-patternable dielectric material has dual-tone properties with a parabola like dissolution response to an irradiation. The disclosed process can also mitigate overlay challenge associated with using a traditional double exposure, double patterning process. Moreover, the disclosed process can also reduce plasma induced dielectric damage during the fabrication of an interconnect structure (single or dual damascene).

In particular, the process of the present disclosure includes the use of a hybrid photo-patternable dielectric (HPPD) material which can serve as both a photoresist material and as a permanent on-chip insulator, after patterning and curing. In the present process, self-aligned double patterns are formed utilizing a single exposure process. After patterning of the HPPD material, the patterned HPPD material can be converted into a permanent patterned on-chip material by curing.

One aspect of the present disclosure relates to a method of fabricating an interconnect structure. In this aspect, the method includes forming a hybrid photo-patternable dielectric (HPPD) material atop a substrate. As mentioned above, the HPPD material has dual-tone properties with a parabola like dissolution response to an irradiation. The HPPD material is then image-wise exposed to an irradiation, wherein a self-aligned pitch split pattern is formed within the HPPD material. By "self-aligned pitch split pattern" it is meant a pattern with minimum feature size about one half of the minimum feature size (pitch splitting) of a pattern formed otherwise with single exposure using the same mask and tool set wherein the pitch split pattern is aligned (placed) without the need for external assistance as in traditional double exposure, double patterning. After the image-wise exposing step, a portion of the self-aligned pitch split pattern is removed to provide a self-aligned pitch split patterned HPPD material having at least one opening therein. The self-aligned split pitch patterned HPPD material is converted into a cured and patterned permanent on-chip dielectric material having the at least one opening therein. Next, the at least one opening is filled with at least an electrically conductive material.

In one embodiment, the HPPD material includes a blend of a positive-tone component and a negative-tone component. During the image-wise exposure step, the positive-tone component of the HPPD material forms a positive-tone latent image and the negative-tone component of the HPPD material forms a negative-tone latent image during just one exposure. Next, part of the positive-tone latent image or part of the negative-tone latent image is removed to provide a self-aligned pitch split patterned HPPD material having at least one opening therein. The self-aligned pitch split patterned HPPD material is then converted into a cured and patterned permanent on-chip dielectric material having the at least one opening therein. The at least one opening within the cured and patterned dielectric material is then filled with at least an electrically conductive material.

In another embodiment of the present disclosure, the HPPD material that can be employed comprises a blend of a photoacid generator and a photobase generator in a chemically amplified positive-tone or negative-tone resist.

Another aspect of the present disclosure relates to a method of fabricating an interconnect structure which further includes a step of trimming (or cutting) and/or filling the dielectric after formation of the self-aligned pitch split patterned HPPD material. This trimming step provides proper wire routing in the finished interconnect. The trimming step can be achieved with lithography or lithography in combination with reactive ion etching.

Another aspect of the present disclosure relates to a method of forming an interconnect structure that includes forming a HPPD material atop a substrate. The HPPD material is then image-wise exposed to an irradiation, wherein a first self-aligned pitch split pattern is formed within the HPPD material. After the image-wise exposing step, a portion of the first self-aligned pitch split pattern is removed to provide a first self-aligned pitch split patterned HPPD material having at least one opening therein. Another HPPD material is formed atop the first self-aligned pitch split patterned HPPD material having the at least one opening therein. The another HPPD material is image-wise exposed to an irradiation, wherein a second self-aligned pitch split pattern is formed within the another HPPD material. After the image-wise exposing step, a portion of the second self-aligned pitch split pattern is removed to provide a second self-aligned pitch split patterned HPPD material having at least one second opening therein. The first and second self-aligned split pitch patterned HPPD materials are converted into cured and patterned permanent on-chip dielectric materials having the at least one first and one second openings therein. Next, the at least one first and one second openings are filled with at least an electrically conductive material.

Another aspect of the present disclosure relates to a HPPD composition which can be used to form the HPPD material mentioned above. In one embodiment, the HPPD composition includes at least one positive-tone component including a positive-tone polymer, a positive-tone copolymer, or a blend of positive-tone polymers and/or positive-tone copolymers having one or more acid sensitive positive-tone functional groups; at least one negative-tone component including a negative-tone polymer, a negative-tone copolymer, or a blend of negative-tone polymers and/or negative-tone copolymers having one or more acid sensitive negative-tone functional groups; at least one photoacid generator; and at least one solvent that is compatible with the positive-tone and negative-tone components.

In another embodiment, the HPPD composition includes a chemically amplified positive-tone or negative-tone resist; a blend of a photoacid generator and a photobase generator and a solvent. In one instance of this embodiment, the HPPD composition can include at least one positive-tone polymer, a positive-tone copolymer, or a blend of positive-tone polymers and/or positive-tone copolymers having one or more acid sensitive positive-tone functional groups; a blend of photoacid generator and a photobase generator; and a solvent. In another instance of this embodiment, the HPPD composition includes at least one negative-tone polymer, a negative-tone copolymer, or a blend of negative-tone polymers and/or negative-tone copolymers having one or more acid sensitive negative-tone functional groups; a blend of photoacid generator and a photobase generator; and a solvent.

A still further aspect of the present disclosure relates to an interconnect structure which includes a line level having at least one electrically conductive filled line embedded within a dielectric material located directly above a via level, said via level includes a cured and patterned permanent on-chip hybrid photo-patternable dielectric material that has an electrically conductive filled self-aligned via embedded therein, wherein said electrically conductive filled self-aligned via comprises a permanent dielectric spacer separating neighboring electrically conductive filled regions of said self-aligned via.

DETAILED DESCRIPTION

The present disclosure, which provides a method of forming a self-aligned interconnect structure in which a singleexposure-no-etch, self-aligned pitch splitting technique and a hybrid photo-patternable dielectric material are employed, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
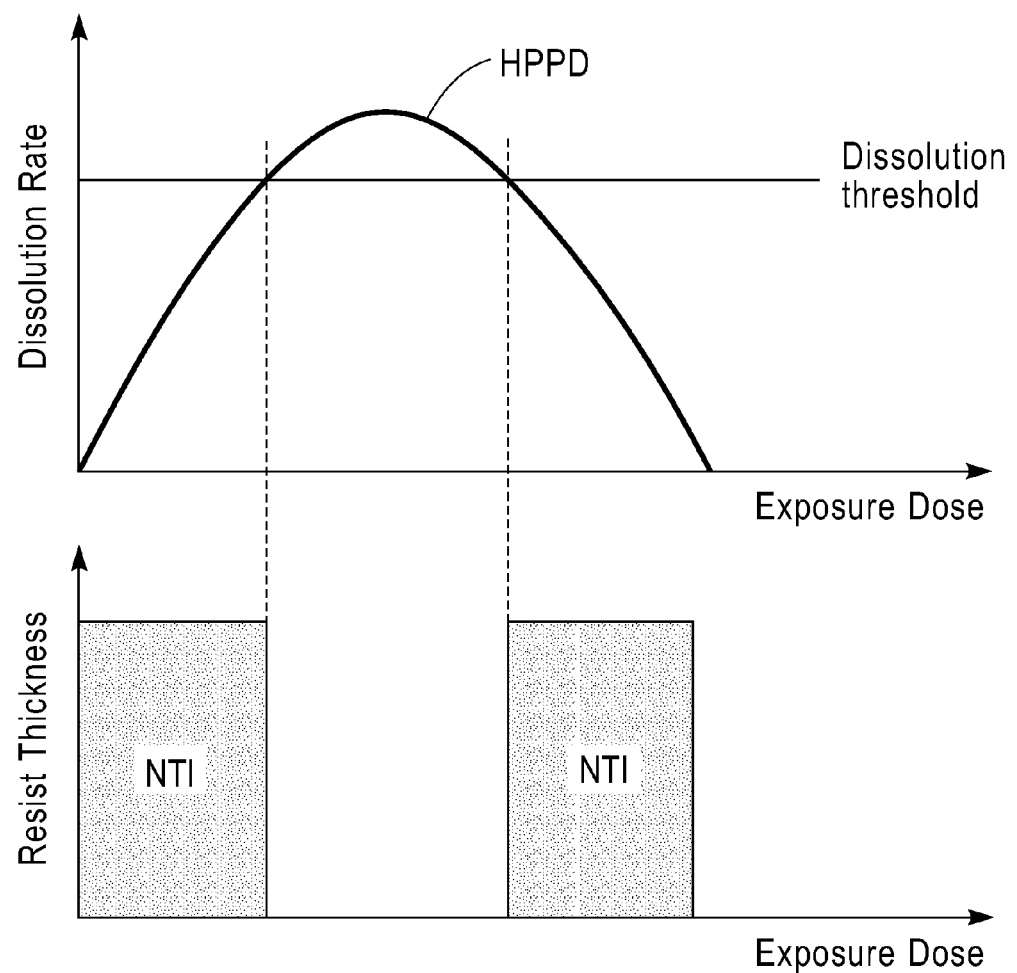
FIG. 1 is a pictorial representation of a response curve (dissolution rate) of a hybrid photo-patternable dielectric material to an irradiation.

Reference is first made to FIG. 1 which illustrates the patterning principle of a hybrid photo-patternable dielectric (HPPD) material of the present disclosure. The method which is used herein capitalizes on a unique dual-tone property of a hybrid photo-patternable dielectric material with a parabola like dissolution response to an irradiation as is shown, for example, in the curve labeled as HPPD in FIG. 1. FIG. 1 also shows the region in which a positive-tone image (labeled as PTI) and the region in which a negative-tone image (labeled as NTI) are formed.

This parabola like dissolution response to an irradiation in the hybrid photo-patternable dielectric material as shown by curve HPPD of FIG. 1 can be achieved by two ways: one is to form a blend of a positive-tone photoresist with a negative-tone photoresist, the other is to use a blend of a photoacid generator and a photobase generator in a chemically amplified positive-tone or negative-tone resist.

In the blended resist case, this hybrid photo-patternable material is insoluble in the unexposed area and the heavily exposed hybrid photo-patternable material because of an insufficient amount of local acid generated by a photoacid generator in a chemically amplified photoresist in the unexposed area and crosslinking of the negative-tone component by an excessive amount of acid in the heavily exposed area. But this hybrid photo-patternable material is soluble in areas where it receives an intermediate dose.

In the blended photoacid and photobase case, this hybrid photo-patternable material is insoluble in the unexposed area and the heavily exposed hybrid photo-patternable material because of an insufficient amount of local acid generated by a photoacid generator in a chemically amplified photoresist in the unexposed area and neutralization of photoacid by the photobase in the heavily exposed area. But this hybrid photo-patternable material is soluble in areas where it receives an intermediate dose as there is excess photoacid not completely neutralized by photobase.

Figure 4:
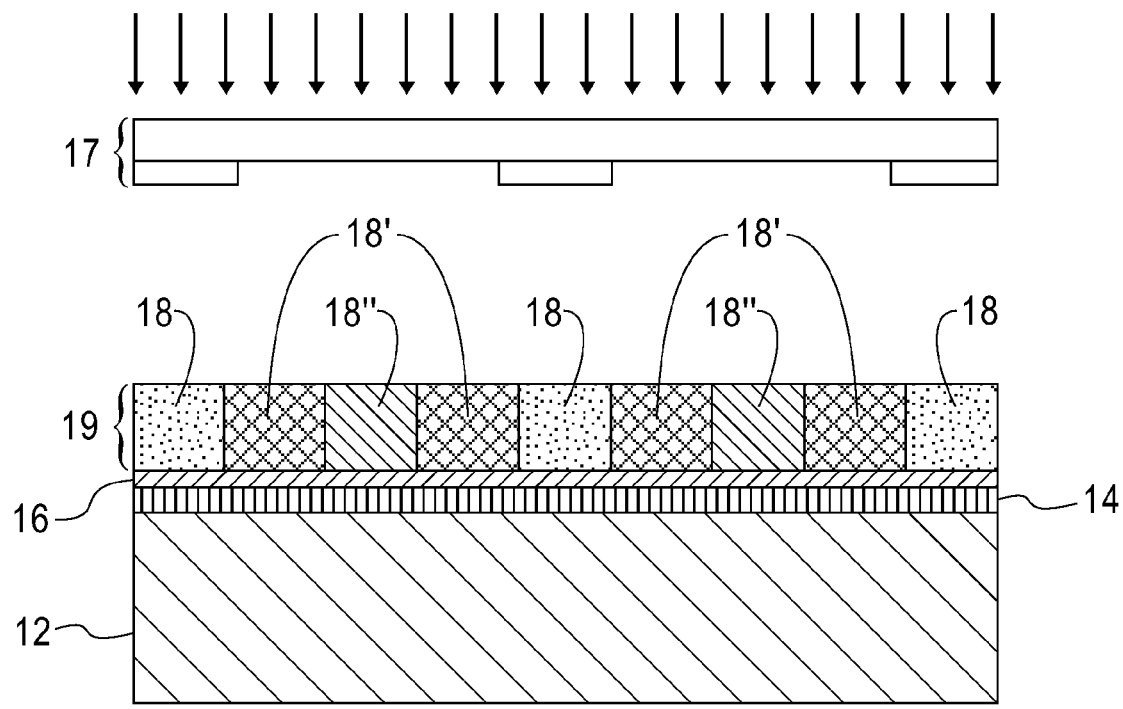
FIG. 4 is a pictorial representation (through a cross sectional view) illustrating the structure of FIG. 3 after exposing the HPPD material to a pattern of radiation.
Figure 5:
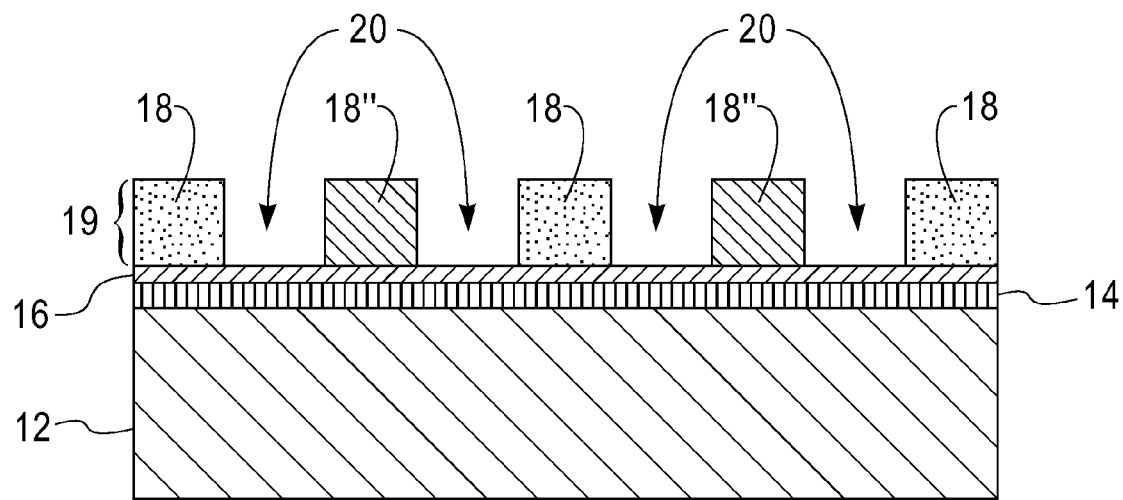
FIG. 5 is a pictorial representation (through a cross sectional view) illustrating the structure of FIG. 4 after removing selected portions of the exposed HPPD material to provide a patterned HPPD material having at least one opening therein.

This solubility response occurs twice as frequent as the maximal intensity of the aerial image, thereby producing pitch splitting. This is illustrated in FIGS. 4-5 of the embodiment that follows.

Reference is made to FIGS. 2-8 which illustrate one embodiment of the present disclosure. Specifically, FIGS. 2-8 illustrate an embodiment in which a single damascene interconnect structure is formed using a single-exposure-no-etch, self-aligned pitch splitting technique and a hybrid photo-patternable dielectric material. Although a method of forming a single damascene interconnect structure is described and illustrated, the present application also contemplates forming a dual damascene structure (to be described in further detail herein below).

Figure 2:
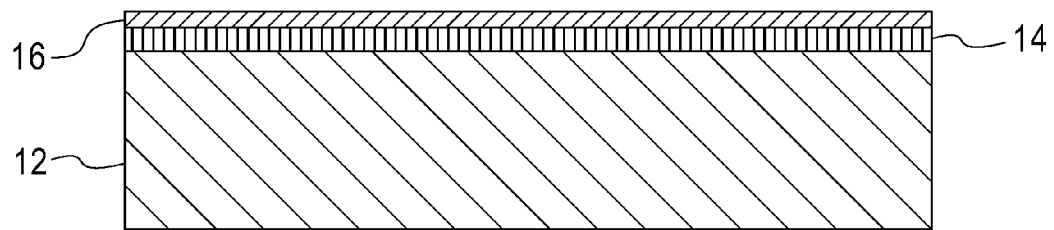
FIG. 2 is a pictorial representation (through a cross sectional view) illustrating an initial structure that can be employed in one embodiment of the present disclosure.

Referring first to FIG. 2, there is illustrated an initial interconnect structure 10 that can be employed in one embodiment of the present disclosure. The initial interconnect structure 10 of FIG. 2 includes a substrate 12, an optional dielectric cap 14 and an antireflective coating (ARC) 16. The ARC 16 may be located on an upper surface of the optional dielectric cap 14, if present. Alternatively, and when the optional dielectric cap 14 is not present, the ARC 16 is located on an upper surface of substrate 12.

Substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. Substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride, carbon nanotubes, graphene or combinations thereof including multilayers.

When present, the optional dielectric cap 14 can be formed directly on an upper surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The optional dielectric cap 14 can include any suitable dielectric capping material such as, for example, SiC, SiN, $SiO_2$, a carbon doped oxide, a nitrogen and hydrogen doped silicon carbide SiC(N,H) or multilayers thereof. The optional dielectric cap 14 can be a continuous layer or a discontinuous layer. The optional dielectric cap 14 can be a layer with graded composition in the vertical direction. The optional dielectric cap 14 can also be a select cap, such as CoWP.

After deposition of the optional dielectric cap 14, a post deposition treatment may be applied to the optional dielectric cap 14 to modify the properties of either the entire layer or the surface of the optional dielectric cap 14. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the optional dielectric cap 14, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate 12 can withstand, usually 500° C. This heat treatment can be conducted in an inert environment or within a chemical environment in a gas phase or a liquid phase. This treatment step may or may not be performed in the same tool as that used in forming the optional dielectric cap 14.

The post deposition treatment by irradiation of electromagnetic wave can be by ultra-violet (UV) light, microwave and the like. The UV light can be broadband with a wavelength range from 100 nm to 1000 nm. The post deposition treatment can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present disclosure: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the optional dielectric cap 14.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the optional dielectric cap 14.

The post deposition chemical treatment may be conducted in a gas phase or a liquid phase. The following conditions may be employed: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire optional dielectric cap 14 or is limited only to the surface of the optional dielectric cap 14. Example chemicals include adhesion promoters such as silanes, siloxanes and silylation agents. This treatment step may or may not be performed in the same tool as that used in forming the optional dielectric cap 14.

The thickness of the optional dielectric cap 14 may vary depending on the technique used to form the same as well as the material make-up of the layer. Typically, the optional dielectric cap 14 has a thickness from 1 nm to 100 nm, with a thickness from 20 nm to 45 nm being more typical.

As stated above, antireflective coating (ARC) 16 can be formed on a surface of the optional dielectric cap 14 if present, or directly on a surface of the substrate 12 when the optional dielectric cap 14 is not present. In some embodiments of the present disclosure, the ARC 16 can be omitted from the initial structure 10.

The ARC 16 employed has all of the following general characteristics: (i) It acts as an ARC during a lithographic patterning process; (ii) It withstands high-temperature BEOL integration processing (up to 500° C.); (iii) It prevents poisoning of at least one of the overlying layers that serve as a photoresist by the substrate; (iv) It provides vertical wall profile and sufficient etch selectivity between one of the overlying layers and the ARC layer; (v) It serves as a permanent dielectric layer in a chip (low dielectric constant, preferably k<5, more preferably k<3.6); and (vi) It is compatible with conventional BEOL integration and produces reliable hardware. Further discussion is now provided for characteristics (i)-(v).

Characteristic (i) the ARC 16 acts as an antireflective coating (ARC) during a lithographic patterning process: ARC 16 may be designed to control reflection of light that is transmitted through an overlying photoresist material (e.g., the hybrid photo-patternable low k (HPPD) material), reflected off the substrate 12 and back into the photoresist material (e.g., the HPPD material), where it can interfere with incoming light and cause the photoresist material (e.g., the HPPD material) to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of the ARC 16 are optimized to obtain optimal resolution, profile control and to maximize the process window of the photoresist material (e.g., the HPPD material) during the subsequent patterning steps, which is well known to those ordinarily skilled in the art.

Characteristic (ii) ARC 16 can withstand high-temperature BEOL integration processing (up to 500° C.): ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents photoresist material poisoning by the substrate: At least the photoresist material (e.g., the HPPD material) employed herein includes a chemically amplified resist. The photoresist material (e.g., the HPPD material) can be poisoned by any basic containment from the underlying substrate, such as a SiCN cap layer. The ARC 16 must serve as a barrier layer to prevent basic contaminant from the underlying substrate from diffusing into the photoresist material (e.g., the HPPD material) to poison the same.

Characteristic (iv) ARC 16 provides vertical wall profile and sufficient etch selectivity between the photoresist material (e.g., the HPPD material) and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the photoresist material (e.g., the HPPD material) should be sufficient to prevent pattern collapse. ARC 16 should also be designed such that the etch selectivity during a subsequent ARC/cap open process is sufficiently high so that the opening of the ARC/cap stack does not erode a significant portion of the photoresist material and degrade significantly its pattern profile. An etch selectivity (etch rate ratio of ARC/cap versus photoresist material) is greater than 1, preferably greater than 3, more preferable greater than 5.

Characteristic (v) ARC 16 serves as a permanent dielectric layer in a chip: ARC 16 remains in the final interconnect structure as a permanent dielectric layer in a chip. Therefore, ARC 16 must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ A/cm$^2$, preferably less than $10^{-7}$ A/cm$^2$, and more preferably less than $10^{-9}$ A/cm$^2$); mechanical properties (adhesion energy is equal to or greater than the cohesive energy of the weakest layer of the integrated film stack); and the ARC employed must pass electrical and mechanical reliability tests.

The thickness of the ARC 16 may vary depending on the technique used to form the same as well as the material make-up of the layer. Typically, the ARC 16 has a thickness from 1 nm to 200 nm, with a thickness from 10 nm to 140 nm being more typical. The ARC 16 may be inorganic or a hybrid of inorganic and organic. The ARC 16 may be a single layer or multilayer. ARC 16 may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as ARC 16 and may be deposited, for example, by plasma-enhanced chemical vapor deposition, spin-on techniques, spray coating, dip coating, etc. ARC 16 may be a single layer or multilayer. When ARC 16 is a multilayer ARC, the deposition of each layer may be the same or a combination of deposition methods can be used. The chemical composition of ARC 16 may be uniform or graded along the vertical direction. After applying ARC 16 particularly those from a liquid phase, a post deposition baking step is usually required to remove unwanted components, such as solvent, and to effect crosslinking. The post deposition baking step of the ARC 16 is typically, but not necessarily always, performed at a temperature from 80° C. to 300° C., with a baking temperature from 120° C. to 200° C. being more typical.

In some embodiments, the as-deposited ARC may be subjected to a post deposition treatment to improve the properties of the entire layer or the surface of ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of ARC 16 and/or a film stack including ARC 16 and optional dielectric cap 14, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current. The conditions described above for the post treatment of the optional dielectric cap 14 may be used for the post treatment for the ARC.

In one embodiment, the ARC 16 that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described for example in U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, C and H are carbon and hydrogen element, respectively, and X is at least one element of O, N, S and F.

In one embodiment, ARC 16 is produced by a vapor or liquid phase deposition (such as, for example, CVD, PECVD, PVD, ALD and spin-on coating) method using appropriate precursors or combination of precursors containing elements described above.

In some embodiments, ARC 16 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane (SiH$_4$) derivatives having the molecular formula SiR$_4$, cyclic Si containing compounds including cyclocarbosilane where the R substitutents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to, silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3- disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, $Si(Net)_4$, can be used as the silicon, carbon and nitrogen source. Another preferred method is a mixture of precursors, a Si containing source such as silane, disilane, or an alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —$[CH_2]_n$—, where n is greater than or equal to 1, and may be substituted by functional groups selected from alkenes (—C═C—), alkynes (—C≡C—), amines (—C—N—), nitriles (—C≡N), amino (—$NH_2$), azido (—N═N═N—) and azo (—N═N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of ARC 16. Broadly, the conditions used for providing ARC 16 that contain the elements Si:C:H:X, include: setting the substrate temperature within a range from 100° C. to 700° C.; setting the high frequency RF power density within a range from 0.1 $W/cm^2$ to 2.0 $W/cm^2$; setting the gas flow rates within a range from 5 sccm to 10000 sccm; setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 sccm to 1000 sccm. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in the ARC are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in the ARC are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in the ARC are as follows: preferably 0 atomic % to 70 atomic %, more preferably 0.5 atomic % to 70 atomic %, most preferably 1 atomic % to 40 atomic % and most highly preferably 5 atomic % to 30 atomic %.

ARC 16 including elements of M, C and H may have a tunable index of refraction and extinction coefficient which can be optionally graded along the film thickness to match the optical properties of the substrate and the photoresist to be formed directly on it. Thus, the optical properties and the lithographic features of the ARC 16 are superior to those obtained by a conventional single layer ARC. The ARC's optical constants are defined here as the index of refraction n and the extinction coefficient k.

ARC 16 including elements of M, C and H can be deposited also in a parallel plate PECVD reactor with the substrate positioned on the grounded electrode. In some embodiments, the ARC 16 can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films.

In another embodiment, the ARC 16 that is employed is formed by a liquid deposition process including for example, spin-on coating, spray coating, dip coating, brush coating, evaporation or chemical solution deposition. This ARC formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Patent Publication No. 2009/0081418 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC 16 formed by liquid deposition may also include at least one second monomer unit, in addition to the at least one monomer unit represented by the formula M-$R^A$. When present, the at least one second monomer unit has the formula M'-$R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising M-$R^A$ or M-$R^A$ and M'-$R^B$ may also comprise at least one additional component, including a separate crosslinker, an acid generator or a solvent. When liquid deposition is employed, the ARC is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of an inorganic ARC composition used in the liquid deposition embodiment comprises M-$R^A$ and M'—$R^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the $MO_y$ unit which can be any one of many different metal-oxide forms. An exemplary list of such metal-oxide forms for a particular metal is as follows: $MO_3$; wherein M is Sc, Y, lanthanide, and Group IIIA; B, Al, Ga or In; $MO_4$; wherein M is Group IVB; Ti, Zr or Hf, and Group IVA; Sn or Ge; $MO_5$; wherein M is Group VB; V, Nb or Ta; or P. The Group VB metals are also known to form stable metal oxo forms, $LMO_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following preferred embodiment of the present invention. In one embodiment, the ARC 16 formed by liquid deposition is characterized by the presence of a silicon-containing polymer having units selected from an organo germanium compound, an organo hafnium compound, an organo aluminum compound, an organo hafnium compound, a siloxane, silane, carbosilane, oxycarbosilane, silsesquioxane, alkyltrialkoxysilane, tetraalkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should be soluble to form a solution and have film-forming characteristics conducive to forming ARC 16 by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

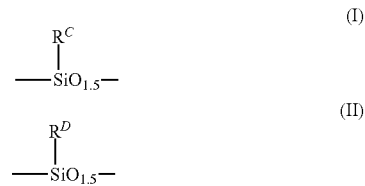

where $R^C$ comprises a chromophore and $R^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for $R^C$-containing monomers may be represented as structure (III) below and the average structure for $R^D$-containing monomers may be represented by structure (IV) below:

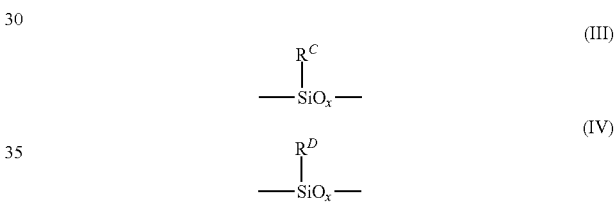

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups $R^C$ (or $R^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC is poly (4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly (p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly (p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC preferably have a weight average molecular weight, before reaction with the cross-linking component, of at least 1000, more preferably a weight average molecular weight of 1000-10000.

The cross-linking component of the liquid deposited ARC is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective coating compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

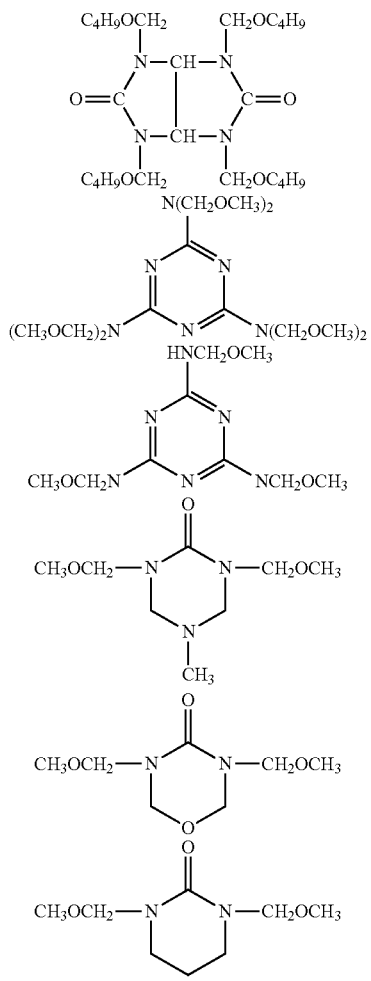

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from an organo germanium compound, an organo hafnium compound, an organo aluminum compound, an organo hafnium compound, a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective coating compositions used in the liquid deposition process preferably contain (on a solids basis) in a suitable solvent commonly known to those skilled in the art (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC 16, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC may further undergo a post curing treatment process. This post curing treatment may include one of the post treatments used above for the optional dielectric cap. As such, the various post treatments and conditions used above in treating the optional dielectric cap are incorporated herein by reference.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, the ARC 16 can be modeled so as to find optimum optical parameters (n and k values) of ARC as well as optimum thickness. The preferred optical constants of the ARC are in the range from n=1.4 to n=2.6 and k=0.01 to k=0.78 at a wavelength of 248, 193 and 157, 126 nm and extreme ultraviolet (13.4 nm) radiation.

In addition to the above, the ARC 16 in any embodiment has good etch selectivity during pattern transfer. Etch selectivities of 1.5-4 to 1 of the ARC 16 to cured dielectric materials can be obtained. Furthermore, the use of the ARC 16 as described above (vapor or liquid deposited) maintains the pattern and structural integrity after curing of the patterned dielectric materials. This is critical as the ARC 16 is retained as a permanent part of the final interconnect stack.

In some embodiments of the invention, the optional dielectric cap 14 and the ARC 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

Figure 3:
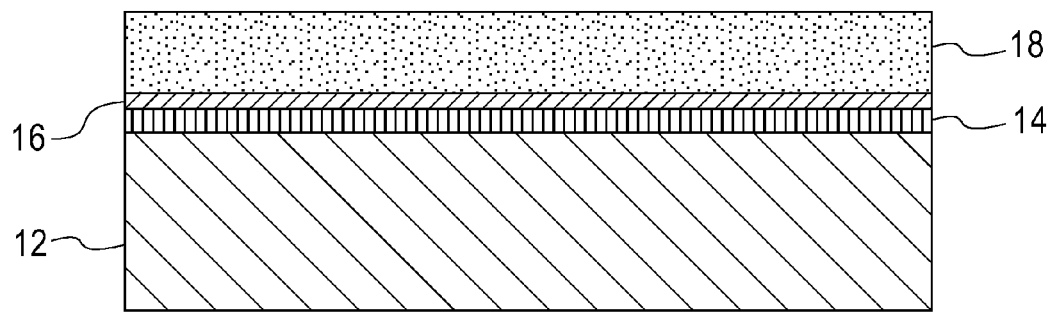
FIG. 3 is a pictorial representation (through a cross sectional view) illustrating the structure of FIG. 2 after forming a hybrid photo-patternable dielectric (HPPD) material on an upper most surface of the initial structure.

Referring now to FIG. 3, there is illustrated the initial structure 10 of FIG. 2 after forming a hybrid photo-patternable dielectric (HPPD) material 18 on an upper surface of the initial structure 10. In the particular embodiment illustrated, the HPPD material 18 is formed directly on an upper surface of ARC 16. In some embodiments, the HPPD material 18 can be formed directly on an upper surface of the substrate 12.

The HPPD material 18 employed in the present application includes any dielectric material that provides pitch splitting capability with a single exposure and upon subsequent curing forms a permanent on-chip insulator. That is, the HPPD material 18 employed in the present application is any dielectric material that has a dual-tone property with a parabola like dissolution response to an irradiation as is shown, for example, in the curve labeled HPPD of FIG. 1. This parabola like dissolution response to an irradiation in the HPPD material 18 can be achieved by two ways: one is to form a blend of a positive-tone photoresist with a negative-tone photoresist (HPPD type 1); the other is to use a blend of a photoacid generator and a photobase generator in a chemically amplified positive-tone or negative-tone resist (HPPD type 2).

In the type 1 HPPD material, the HPPD material is insoluble in the unexposed area (because of an insufficient amount of local acid generated by a photoacid generator in a chemically amplified resist in the unexposed area) and the heavily exposed resist (due to the crosslinking of the negative-tone component by an excessive amount of acid in the heavily exposed area). But it is soluble in areas (due to the solubility switch of the positive-tone component of the HPPD) where it receives an intermediate dose. By "negative-tone" it is meant that the part of the HPPD material 18 that is exposed to an actinic irradiation will not be removed by a conventional developer, while the unexposed part of the photoresist is removed. By "positive-tone" it is meant that the part of the HPPD material 18 that is exposed to an actinic irradiation will be removed by a conventional developer, while the unexposed part of the photoresist is not removed.

In the type 2 HPPD material, the HPPD material is insoluble in the unexposed area (because of an insufficient amount of local acid generated by a photoacid generator in a positive-tone chemically amplified resist in the unexposed area) and the heavily exposed resist (due to the neutralization of photoacid by the photobase in the heavily exposed area). But this hybrid resist is soluble in areas where it receives an intermediate dose as there is excess photoacid not completely neutralized by photobase.

Notwithstanding the type of HPPD material employed, the HPPD material 18 acts a photoresist during a lithographic patterning process, and as such, no separate photoresist material is employed. After lithographic patterning, portions of the HPPD material that are not removed can be converted into a permanent on-chip dielectric material during a post patterning cure. The dielectric constant (k) of the cured HPPD material can be a low k material or a high-k material; the k range for a typically HPPD material that can be employed in the present application is from 1 to 30. By low k, it is meant that the cured and patterned HPPD material has a dielectric constant less than that of silicon oxide (k=4.3), with a dielectric constant of about 3.8 or less being more typical. By high k, it is meant that the cured and patterned HPPD material has a dielectric constant higher than that of silicon oxide (k=4.3), with a dielectric constant of about 7 or more being more typical.

The cured product of the patterned HPPD material can serve as a permanent on-chip dielectric insulator. In the present disclosure, the terms "cure" or "curing" are used interchangeable to refer to one of the processes selected from a thermal cure, an electron beam cure, an ultra-violet (UV) cure, an ion beam cure, a plasma cure, a microwave cure or a combination thereof. A "cured" product of the patterned HPPD material is the product of the patterned HPPD material after it has undergone one of the aforementioned cure processes. The "cured" product of a dielectric coating material is different from the originally deposited dielectric coating material in chemical nature and physical, mechanical and electrical properties.

In one embodiment and as mentioned above (see type 1 HPPD material), the HPPD material 18 comprises a composition that includes at least one positive-tone component including a positive-tone polymer, a positive-tone copolymer, or a blend of a positive-tone polymers and/or a positive-tone copolymers having one or more acid sensitive positive-tone functional groups; at least one negative-tone component including a negative-tone polymer, a negative-tone copolymer, or a blend of a negative-tone polymers and/or a negative-tone copolymers having one or more acid sensitive negative-tone functional groups; at least one photoacid generator, and at least one solvent that is compatible with the positive-tone and negative-tone components of the HPPD material 18. The acid sensitive negative-tone functional groups are functional groups for causing a crosslinking reaction which, in turn, causes the exposed areas to be insoluble in a developer to form a negative-tone relief image after development. The acid-sensitive positive-tone functional groups are acid sensitive protecting groups which cause the exposed region to be soluble in a developer to form a positive-tone relief image after development.

When a blend of polymer or copolymer is used, the composition of the one polymer or copolymer component in the blend formulation is from 1 to 99% of the total polymer composition. In a preferred embodiment, the composition of the acid sensitive polymer or copolymer is from 20 to 80% of the total polymer composition, and even more preferred, 30 to 60%.

In another embodiment and as mentioned above (see type 2 HPPD material), the HPPD material 18 comprises a composition that includes at least one positive-tone polymer, a positive-tone copolymer, or a blend of positive-tone polymers and/or positive-tone copolymers having one or more acid sensitive positive-tone functional groups; a blend of photoacid generator and a photobase generator; and a solvent. In yet another embodiment and as mentioned above (see type 2 HPPD material), the HPPD material comprises a composition that includes at least one negative-tone polymer, a negative-tone copolymer, or a blend of negative-tone polymers and/or negative-tone copolymers having one or more acid sensitive negative-tone functional groups; a blend of photoacid generator and a photobase generator; and a solvent. In yet a further embodiment and as mentioned above (see type 2 HPPD material), the HPPD material further comprises a cross-linking component.

Negative-tone functional groups for both types of HPPD materials mentioned above are preferably selected from among linear or branched alkyls which are substituted with OH, C(O)OH, and/or F; cycloalkyls which are substituted with OH, C(O)OH, and/or F; aromatics which are substituted with OH, C(O)OH, and/or F; arenes that are substituted with OH, C(O)OH, and/or F; and acrylics which are substituted with OH, C(O)OH, and/or F.

Crosslinking via condensation in the presence of an acid generated by a photoacid generator under exposure to radiation is not limited to alcohol, phenol, acetic acid, silanols, but may also include halosilanes, acetoxysilanes, silylamines, and alkoxysilanes. Organic crosslinking agents, such as methylphenyltetramethoxymethyl glycouril (methylphenyl powderlink), may also be included in the formulation. Although photoacid generators are preferred for crosslinking, photobase generators can also be used for crosslinking silanol polymers, copolymers or blends of polymer or copolymers.

Positive-tone functional groups for both types of HPPD materials is selected from carbonyls, esters, ethers, acetals, ketals and aliphatic silylethers. They are incorporated into the polymers and/or copolymers as protecting groups for base soluble functional groups such as phenol, acetic acid, F-substituted alcohols and the like.

The extent of protection and the amount of co-monomer present in the acid-sensitive polymers or copolymers are such that the photo-patternable dielectric material composition will provide good lithography performance, i.e., high resolution and good process window. It should also maintain pattern integrity after post cure processing patterning. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed include, but are not limited to, phenolic carbonates; t-alkoxycarbonyloxys such as t-butoxylcarbonyloxy and isopropyloxycarbonyloxy.

Some examples of cyclic and branched ethers that may be employed include, but are not limited to, benzyl ether and t-alkyl ethers such t-butyl ether. Of the aforesaid ethers, it is highly preferred to use t-butyl ether.

Examples of cyclic and branched esters that can be employed are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed include, but are not limited to, phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl.

Illustrative examples of silylethers that can be employed include, but are not limited to, trimethylsilylether, dimethylethylsilylether and dimethylpropylsilylether.

Each type of HPPD composition that can be employed in the present disclosure includes a photosensitive acid generator (PAG). Examples of preferred PAGs include, -(trifluoromethylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,371,605. The content of the '605 patent is incorporated herein by reference. A weaker acid generated from a PAG such as N-hydroxy-naphthalimide (DDSN) may be used. Combinations of PAGs may also be used.

Photobase generators, like photoacid generators, usually generate a strong base, such as amines diamines, piperidine, pyridine, under irradiation. One class of such photobase generators is o-nitrobenzyl carbamate, such as o-nitrobenzyl N,N-diisopropylcarbamate (DIPA-CARB), o-nitrobenzyl N,N-dicyclohexylcarbamate, 4-[N-Allylcarbamoyl]oxy-N-[[(3,5dimethoxybenzyl)oxy]carbonyl]piperidine, N-Allyl-[(2-nitro-4,5-dimethoxybenzyl)oxy]carbonyl Amine, N-Allyl-[(o-Nitrobenzyl)oxy]carbonyl Amine, 4-[N-Allylcarbamoyl]oxy-N-[[methyl(o-nitrobenzyl)oxy]carbonyl]piperidine.

When a blend of a photoacid generators and photobase generators is used in type-2 HPPD, the composition of the photoacid generator or photobase generator in the blend formulation is from 1 to 99% of the total photoacid generator or photobase generator composition. In a preferred embodiment, the composition of the acid sensitive polymer or copolymer is from 20 to 80% of the total photoacid generator or photobase generator composition, and even more preferred, 30 to 60%.

In optimizing the photolithography process, an organic base may be added to the formulation. The base employed may be any suitable base known in the resist art. Examples of bases include tetraalkylammonium hydroxides, cetyltrimethylammonium hydroxide, and 1,8-diaminonaphthalene. The compositions are not limited to any specific selection of base.

A casting solvent is used to dissolve the other components in the photo-patternable dielectric composition. Examples of suitable casting solvent include, but are not limited to, ethoxyethylpropionate (EEP), a combination of EEP and γ-butyrolactone, propylene-glycol monomethylether alcohol and acetate, propyleneglycol monopropyl alcohol and acetate, and ethyl lactate, n-pentanol, and 4-methyl-2-pentanol. Combinations of these solvents may also be used.

The hybrid photo-patternable dielectric (HPPD) compositions of the present disclosure preferably contain (on a solids basis) (i) from about 50 to about 98 wt. % of a polymer or copolymer or a blend of polymers or copolymers, more preferably from about 70 to about 80 wt. %, (ii) from about 0 to about 50 wt. % of cross-linking component, more preferably from about 3 to about 25%, most preferably about from about 5 to about 25 wt. %, and (iii) from about 1 to about 20 wt. % acid generator or a blend of a photoacid generator and a photobase generator, more preferably about 1-15 wt. %. The total solid content of the hybrid photo-patternable dielectric (HPPD) compositions of the present disclosure is from 0.01 wt % to 99 wt %, more preferably from about 1 to about 30 wt. %.

Optionally the HPPD material 18 may be a composition further comprising at least one microscopic pore generator (porogen). The pore generator may be or may not be acid sensitive.

The HPPD composition used in forming the HPPD material 18 can be made using techniques such as, for example, mixing and blending, which are well known to those skilled in the photoresist art.

It is noted that when HPPD composition is a type 1 HPPD composition comprising a positive-tone polymer and/or negative-tone polymer, the positive-tone polymer and/or negative-tone polymer includes at least one monomer (to be described in greater detail below). When the HPPD composition is comprised of a positive-tone copolymer and/or negative-tone copolymer, the positive-tone copolymer and/or negative-tone copolymer includes at least two monomers (to be described in greater detail below). The blends of positive-tone and/or negative-tone polymers and/or positive-tone and/or negative-tone copolymers include at least two of any combination of positive-tone and/or negative-tone polymers and/or positive-tone and/or negative-tone copolymers described below.

It is also noted that these positive-tone or negative-tone acid-sensitive polymer or copolymer can also be used in the type 2 HPPD material along with a blend of a photoacid generator and a photobase generator.

In general terms, the HPPD material 18 is a composition including a positive-tone and/or negative-tone polymer, a positive-tone and/or negative-tone copolymer, or a blend including at least two of any combination of acid-sensitive positive-tone and/or negative-tone polymers and/or positive-tone and/or negative-tone copolymers, wherein the positive-tone and/or negative-tone polymers include one monomer and the positive-tone and/or negative-tone copolymers include at least two monomers and wherein the monomers of the polymers and the monomers of the copolymers are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the HPPD material 18 that can be employed is a composition comprising an acid-sensitive positive-tone and/or negative-tone polymer of one monomer or a positive-tone and/or negative-tone copolymer of at least two monomers selected from siloxane, silane, carbosilane, oxycarbosilane, organosilicates, silsesquioxanes and the like. The HPPD material 18 may also be a composition comprising a positive-tone and/or negative-tone polymer of one monomer or a copolymer of at least two monomers selected from alkyltrialkoxysilane, tetra-alkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the dielectric coating material may comprise a blend including at least two of any combination of acid-sensitive polymers and/or copolymers, wherein the polymers include one monomer and the copolymers include at least two monomers and wherein the monomers of the polymers and the monomers of the copolymers are selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Illustrative positive-tone and/or negative-tone polymers for the HPPD material 18 include, but are not limited to, siloxane, silane, carbosilane, oxycarbosilane, silsesquioxane-type polymers including caged, linear, branched or combinations thereof. Examples of the above mentioned polymers and/or copolymers that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009, now U.S. Patent Application Publication No. 2011/0074044, all of which are incorporated herein by reference in their entirety.

In some embodiments, the HPPD material 18 may be formed from a composition that optionally includes an additional cross-linker. The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The HPPD material 18 can be formed utilizing a deposition process including, for example, spin-on-coating, dip coating, spray coating, brush coating, blade coating, and ink-jet dispensing. After applying the HPPD material 18, a post deposition baking step is typically, but not necessarily always, required to remove unwanted components, such as solvent. When performed, the baking step can be conducted at a temperature from 40° C. to 200° C., with a baking temperature from 60° C. to 140° C. being more typical. The duration of the baking step varies from 10 seconds to 600 seconds and is not critical herein.

The thickness of HPPD material 18 may vary depending on the type of HPPD material employed as well as the type of deposition process that is used in forming the same. Typically, HPPD material 18 has a thickness from 1 nm to 50000 nm, with a thickness from 10 nm to 5000 nm being more typical.

Referring now to FIG. 4, there is illustrated the structure of FIG. 3 after one single image-wise exposing the HPPD 18 to form a self-aligned pitch split pattern (elements 18' and 18") within the HPPD material 18 using a mask 17. Specifically, FIG. 4 illustrates an embodiment in which the image-wise exposure step provides a mixture of positive-tone latent images 18' (with the deprotection of the positive-tone polymer, a positive-tone copolymer or blend of positive-tone polymers or positive-tone copolymers) and negative-tone latent images 18" (via crosslinking or other solubility switch of the negative-tone polymer, a negative-tone copolymer or blend of negative-tone polymers or negative-tone copolymers) of a desired circuitry; reference numeral 18 is maintained in FIG. 4 to denote the non-exposed portions of the HPPD material. The latent images 18' and 18" can be a via image or a line image with a line image being preferred. In particular, FIG. 4 illustrates the structure that is formed after pitch splitting the HPPD material using a single exposure.

It is noted that the pitch split patterns thus formed are self-aligned. In other words, the positive-tone and the negative-tone latent images are formed with one single exposure without the need for external assistance for alignment during the second exposure as in prior art double exposure double patterning methods.

The image-wise exposing process can be accomplished in a variety of ways, including, for example, through a mask with a lithography stepper or a scanner with an exposure light source of G-line, Mine (365 nm), DUV (248 nm, 193 nm, 157 nm, 126 nm), Extreme UV (13.4 nm, 5.7 nm), or an electron beam, an ion beam. The image-wise exposing process may be performed in a dry mode or an immersion mode with an immersion liquid between the exposure lens and the HPPD film. The image-wise exposing process also includes direct writing without the use of a mask with, for example, a light, an electron beam, an ion beam, and scanning probe lithography.

In some embodiments, an optional post-exposure baking step may be required to effect a desired photochemical reaction. When performed, the post-exposure baking step is conducted at a temperature from 60° C. to 200° C., with a post-exposure baking temperature from 80° C. to 140° C. being more typical. The duration of the post-exposure baking step varies and is not critical herein.

Referring now to FIG. 5, there is illustrated the structure of FIG. 4 after removing one of the positive-tone latent images

18' and retaining the negative-tone latent images 18" to provide a patterned HPPD material having at least one opening 20 located therein. The at least one opening 20 exposes an underlying surface of one of the ARC 16, or the substrate 12. In FIG. 5, the patterned HPPD material is labeled as 19 and it consists of non-exposed portions of the HPPD material 18 and the other of the positive-tone or negative-tone latent image that was not removed. In the specific embodiment illustrated in FIG. 5, the positive-tone latent images 18' are removed. The removal of one of the positive-tone latent images 18' and retaining the negative-tone latent images 18" is achieved utilizing a conventional developer that is well known to those skilled in the photolithography art. In the specific embodiment illustrated in FIG. 5, the latent images 18' are removed by an aqueous base solution, such as 0.26N tetramethylammoniahydroxide (TMAH) solution, while the negative-tone latent images 18" is retained due to crosslinking or other solubility switch mechanisms.

Figure 6:
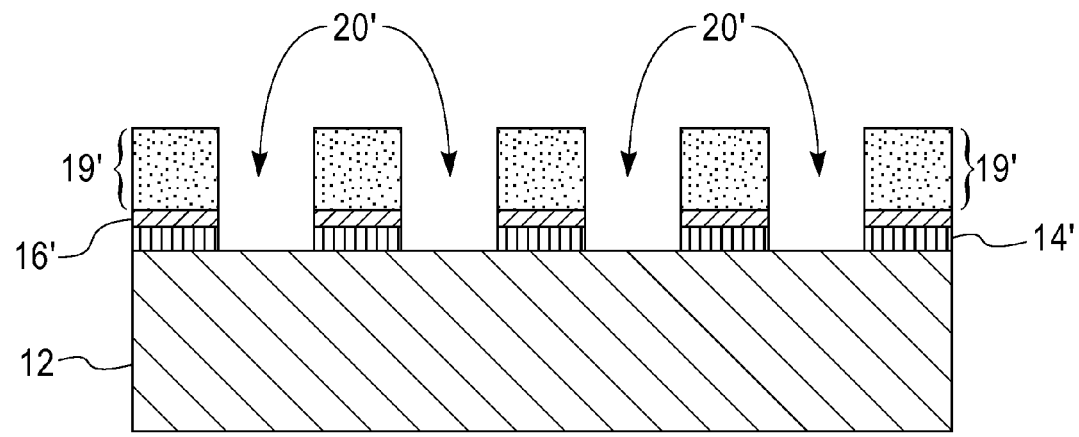
FIG. 6 is a pictorial representation (through a cross sectional view) illustrating the structure of FIG. 5 after extending the at least one opening into at least a portion of the initial structure and converting the patterned HPPD material into a cured and patterned dielectric material.

Referring now to FIG. 6, there is illustrated the structure of FIG. 5 after extending each opening 20 through ARC 16 and optional dielectric cap 14 to an upper surface of substrate 12 and converting the patterned HPPD material 19 into a cured and patterned permanent on-chip dielectric material 19' having a dielectric constant as mentioned above. The cured and patterned dielectric material 19' is a permanent component of the structure disclosed in this application.

The extended opening is labeled as 20' in FIG. 6. The extending of the opening 20 is not needed in embodiments in which no ARC 16 or optional dielectric cap 14 is present. The step of extending the opening, which is used to 'open' the ARC 16 and, if present, the optional dielectric cap 14, includes any etching process such as, for example, plasma etching, reactive ion etching or gas cluster ion beam etching. In FIG. 6, reference numeral 16' denotes a patterned ARC, and reference numeral 14' denotes a patterned dielectric cap.

The order of extending the opening and converting the patterned HPPD material into a cured and patterned dielectric material is not critical. In some embodiments, the extending the opening is performed prior to the curing step, while in another embodiments, the extending the opening occurs after the curing step.

The converting of the patterned HPPD material 19 into the cured and patterned permanent dielectric material 19' is performed by a curing process including, for example, a thermal cure, an electron beam cure, an ultra-violet (UV) cure, an ion beam cure, a plasma cure, a microwave cure or a combination thereof. The conditions for each of the curing processes are well known to those skilled in the art and any condition can be chosen as long as it coverts the patterned HPPD material 19 into a permanent on-chip dielectric and maintains pattern fidelity. It is observed that the converting process can also be used to cure the ARC material.

In one embodiment, an irradiation cure step is performed by a combination of a thermal cure and an ultra-violet (UV) cure wherein the wavelength of the ultra-violet (UV) light is from 50 nm to 300 nm and the light source for the ultra-violet (UV) cure is a UV lamp, an excimer (exciplex) laser or a combination thereof.

The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 nm to 300 nm. Additionally, the light of the ultra-violet (UV) cure may be enhanced and/or diffused with a lens or other optical diffusing device known to those skilled in the art.

In one embodiment, this post patterning cure is a combined UV/thermal cure. This combined UV/thermal cure is carried on a UV/thermal cure module under vacuum or inert atmosphere, such as $N_2$, He and Ar. Typically, the UV/thermal cure temperature is from 100° C. to 500° C., with a cure temperature from 300° C. to 450° C. being more typical. The duration of the UV/thermal cure is from 0.5 min to 30 min with a duration from 1 min to 10 min being more typical. The UV cure module is designed to have a very low oxygen content to avoid degradation of the resultant dielectric materials.

In some embodiments, the curing step may be carried out in different or the same tool cluster as that used in forming the HPPD material 18.

Figure 7:
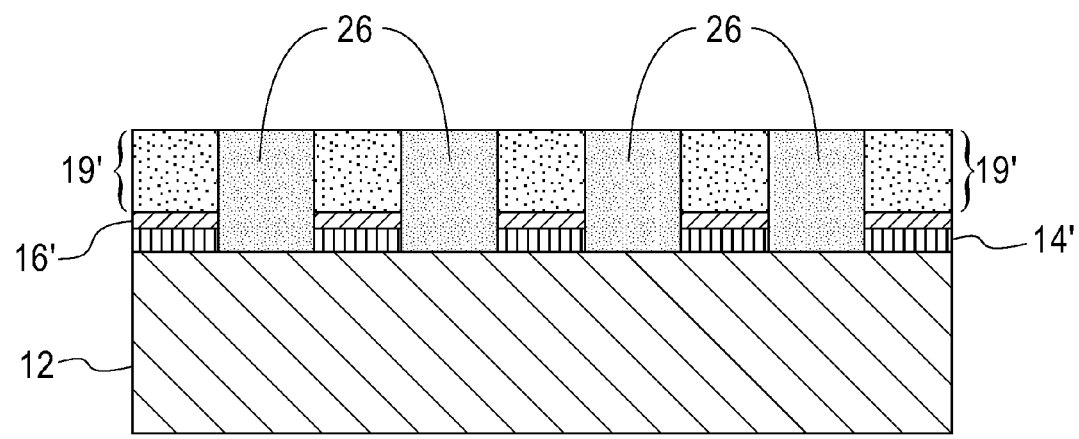
FIG. 7 is a pictorial representation (through a cross sectional view) depicting the structure of FIG. 6 after forming an electrically conductive material within the at least one extended opening.

Referring now to FIG. 7, there is illustrated the structure of FIG. 6 after forming at least an electrically conductive material within each of the extended openings 20'. In some embodiments, a diffusion barrier layer (liner) (not shown), which may comprise Ta, TaN, Ti, TiN, Ru, RuTaN, RuTa, W, WN or any other material that can serve as a barrier to prevent the electrically conductive material from diffusing through, is typically formed into each of the extended openings 20' prior to filling the same with an electrically conductive material. When present the diffusion barrier layer is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier liner may comprise a combination of layers. The thickness of the diffusion barrier liner may vary depending on the exact means of the deposition process employed as well as the material and number of layers employed. Typically, the diffusion barrier liner has a thickness from 4 to 40 nm, with a thickness from 2 to 20 nm being more typical.

Following the formation of the diffusion barrier layer (liner), the remaining region of the extended opening 20' is filled with an electrically conductive material 26 forming a conductive feature. The electrically conductive material 26 used in forming the conductive feature includes, for example, polySi, an electrically conductive metal, an alloy comprising at least one electrically conductive metal, an electrically conductive metal silicide, an electrically conductive nanotube or nanowire, graphene or combinations thereof. Preferably, the electrically conductive material 26 that is used in forming the conductive feature is a conductive metal such as Cu, W or Al, with Cu or a Cu alloy (such as AlCu) being highly preferred in the present invention. The electrically conductive material 26 is filled into the remaining first and second interconnect patterns utilizing a conventional deposition process including, but not limited to CVD, PECVD, sputtering, chemical solution deposition or plating. A preferred filling method is electrochemical plating.

After deposition, a conventional planarization process such as, for example, chemical mechanical polishing (CMP) can be used to provide a structure in which the diffusion barrier layer and the electrically conductive material 26 each have an upper surface that is substantially coplanar with the upper surface of the cured and patterned dielectric material 19'. The resultant structure after electrically conductive material fill and planarization is shown, for example, in FIG. 7.

Figure 8:
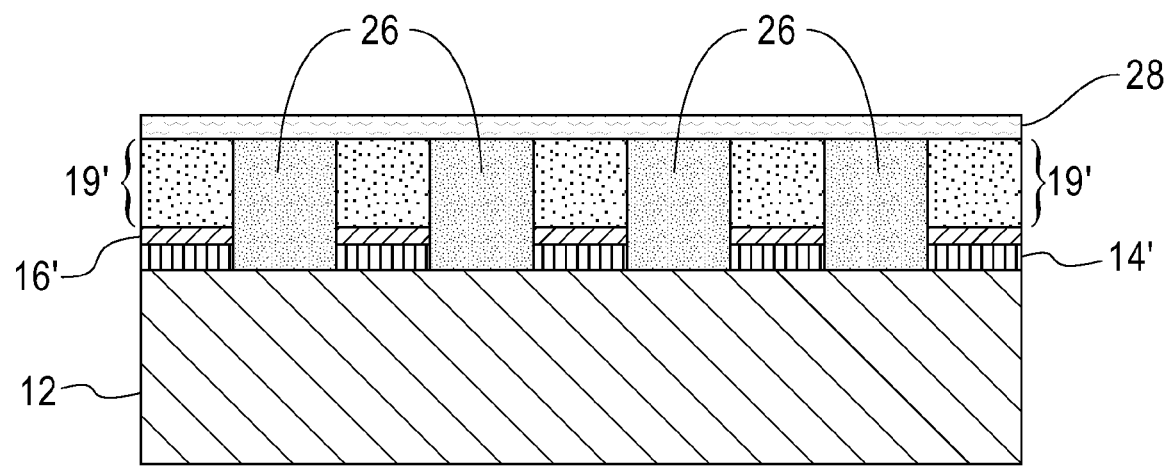
FIG. 8 is a pictorial representation (through a cross sectional view) depicting the structure of FIG. 7 after forming a dielectric cap atop the upper most surface of the structure.

After forming the structure shown in FIG. 7, another dielectric cap 28 can be formed on the upper surfaces of cured and patterned dielectric material 19' as well as atop an upper surface of the electrically conductive material 26. Such a structure including the another dielectric cap 28 is shown in FIG. 8. The another dielectric cap 28 can be formed utilizing the methods described above for optional dielectric cap 14 and the another dielectric cap 28 can comprise the same or different composition as the optional dielectric cap 14.

Figure 9A:
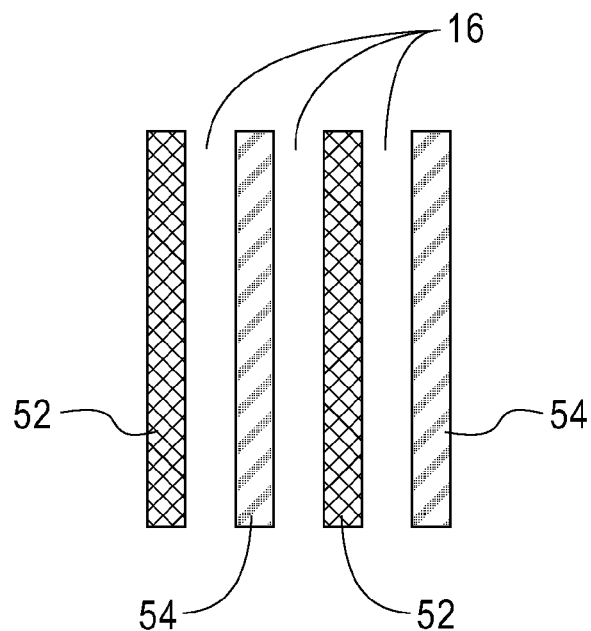
FIGS. 9A-9C are pictorial representations (through top down views) depicting the single-exposure-no-etch self-aligned pitch splitting patterns (FIG. 9A), trimming patterns (FIG. 9B), and final interconnect structure (FIG. 9C) that can be obtained in the present application.
Figure 9B:
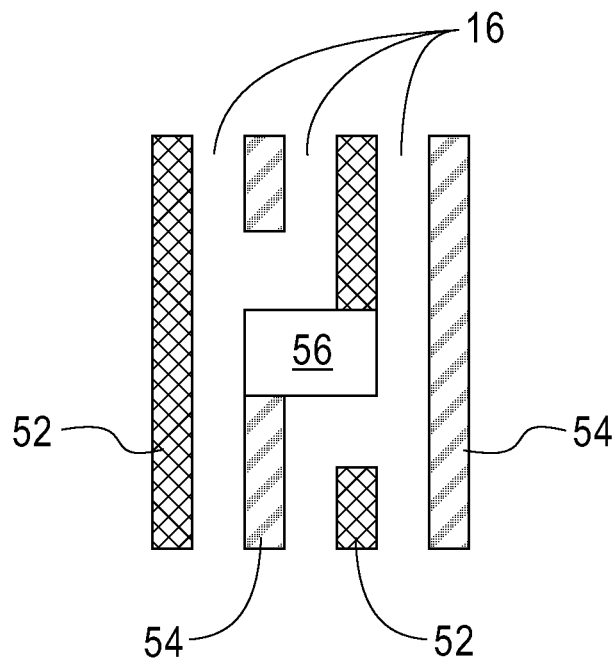
Figure 9C:
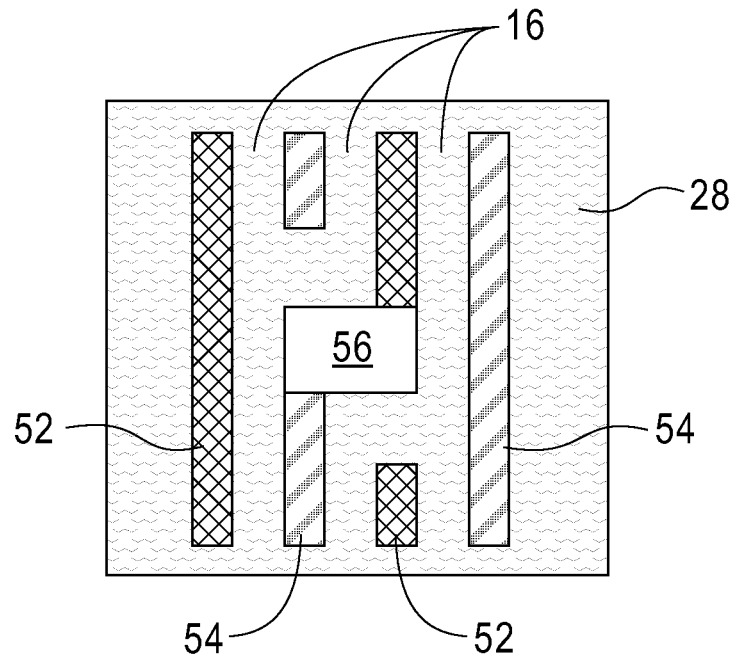

In some embodiments, a dielectric trimming (cutting or blocking) or a filling mask may be used to either generate non-gritted patterns and/or to remove the unwanted features on the gritted regular patterns formed by the single-exposure, pitch split patterns of the HPPD material. This trimming and/or filling process may use the same or different patterning tool as used in patterning the hybrid photo-patternable dielectric material. It can be achieved with the hybrid photo-patternable dielectric material and at least one different photoresist. This dielectric trimming and/or filling process is to ensure electrical connectivity in the final interconnect structure. FIG. 9A shows a top down view of a self-aligned pitch split HPPD material which includes a positive HPPD component 50 and a negative HPPD component 52 located on ARC 16. The structure shown in FIG. 9A is prepared as described above in FIGS. 2-5. FIG. 9D illustrates the structure of FIG. 9A after dielectric trimming and fill. Reference numeral 54 denotes the fill material which is typically a dielectric material. FIG. 9C shows the structure of FIG. 9B after metal fill and planarization. In FIG. 9C, reference numeral 26 denotes the metal fill material.

Although the above embodiment illustrates the formation of a single damascene interconnect structure, the method disclosed herein above can also be used in forming a dual damascene interconnect structure as well. In forming the dual damascene interconnect structure and after forming the structure shown in FIG. 5, another HPPD material (which can be the same or different from HPPD material 18 described above) is formed atop the patterned HPLK material 19 and then the another HPPD material is subjected to exposure and developing providing another patterned HPPD material atop the patterned HPPD material 19. The another patterned HPPD material contains at least one opening (that is the other of a via opening or a line opening that is not present in the patterned HPPD material 19') therein which is located directly above and connected with opening 20 present in the patterned HPPD material 19. The processing described for FIGS. 6-8 can then be performed providing a dual damascene structure.

In another embodiment of dual damascene interconnect structure is formed with the line level fabricated using the hybrid photo-patternable dielectric material described previously and the via level fabricated either by the traditional lithography and etching into a dielectric material or by the hybrid photo-patternable dielectric material described previously. The via level can be circular hole shaped or a bar shaped. It can be self-aligned relative to the line level or non-self-aligned. A preferred embodiment is a self-aligned bar shaped via. When the bar-shaped via level is fabricated by the hybrid photo-patternable dielectric material, a unique via structure with a dielectric spacing embedded within the via metal due to the dual-tone patterning feature of hybrid photo-patternable dielectric material is provided.

Figure 10:
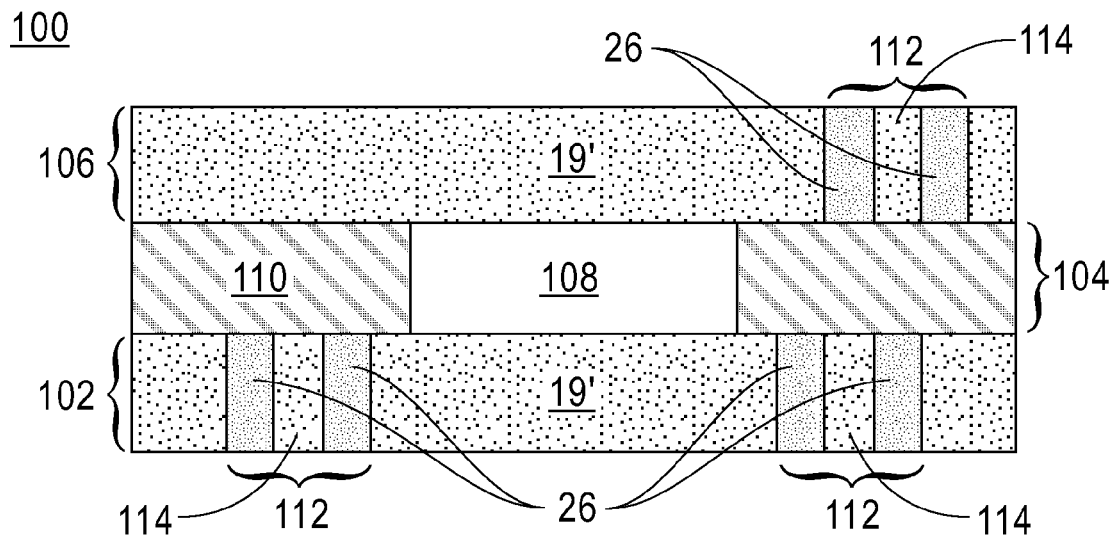
FIG. 10 is a pictorial representation (through a cross sectional view) depicting a dual damascene structure in accordance with an embodiment of the present disclosure in which each via level includes an electrically conductive filled self-aligned via wherein at an outer most edge therein the self-aligned via includes a dielectric spacer embedded therein.
Figure 11:
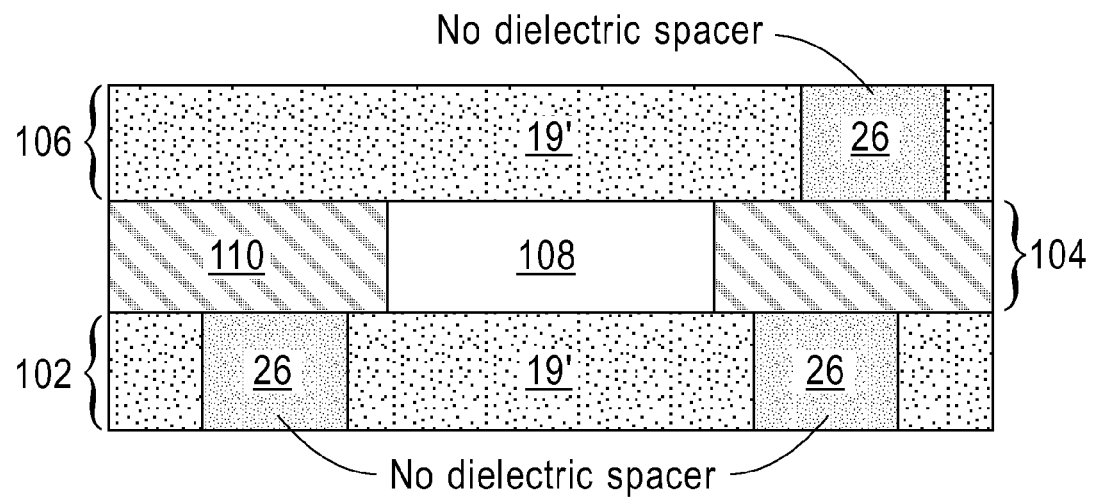
FIG. 11 is a pictorial representation (through a cross sectional view) depicting a dual damascene structure prepared using a prior art dual damascene process.

FIG. 10 depicts a cross-sectional view of a dual damascene interconnect structure where the electrically conductive filled self-aligned via has a dielectric spacing embedded therein. Specifically, FIG. 10 illustrates a dual damascene structure 100 that includes a first via level 102, a line level 104, and an optional second via level 106. At least the first via level 102, and optionally the second via level 106 are formed utilizing the method of the present disclosure. The line level 104 can be formed utilizing the method of this disclosure or any other lithographic patterning technique. The line level 104 includes a dielectric material 108 including a HPPD material or any other type of interlevel dielectric material having a conductive line 110 embedded therein. The first and second via levels 102 and 106 include cured and patterned HDDP material 19' that has an electrically conductive filled self-aligned via 112 embedded therein. As shown, the electrically self-aligned via 112 includes a dielectric spacer 114 located between neighboring electrically conductive filled regions 26. In one embodiment, this dielectric spacer 114 is the cured permanent negative-tone image 18" in FIG. 5. The dielectric spacer 114 is a segment of the cured and patterned HPPD material 19'. It is noted that in the structure shown in the drawings, the outer most edge of the self-aligned via would include a repeating patterned of a first electrically conductive filled region, a dielectric spacer, and a second electrically conductive filled region, whereas the outermost edge of via of a conventional dual damascene structure (see FIG. 11) would only include an electrically conductive material.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A hybrid photo-patternable dielectric composition comprising:
    at least one positive-tone component including a positive-tone polymer, positive-tone copolymer, or blends of positive-tone polymers and/or positive-tone copolymers having one or more acid sensitive positive-tone functional groups;
    at least one negative-tone component including a negative-tone polymer, negative-tone copolymer, or blends of negative-tone polymers and/or negative-tone copolymers having one or more acid sensitive negative-tone functional groups;
    at least one photoacid generator; and
    at least one solvent that is compatible with the positive-tone and negative-tone components, wherein said dielectric composition has a dual-tone property with a dissolution response to an irradiation that increases within a first exposure dose range, reaches a maximum within a second exposure dose range, and decreases within a third exposure dose range.

2. The hybrid photo-patternable dielectric composition of claim 1 further comprising a cross-linking component.

3. The hybrid photo-patternable dielectric composition of claim 1 wherein said positive-tone polymer includes one monomer and said positive-tone copolymer includes at least two monomers and wherein the monomers of the polymer and the monomers of the copolymer are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetraalkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

4. The hybrid photo-patternable dielectric composition of claim 1 wherein said negative-tone polymer includes one monomer and said negative-tone copolymer includes at least two monomers and wherein the monomers of the polymer and the monomers of the copolymer are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

5. The hybrid photo-patternable dielectric composition of claim 1 which comprises on a solids basis from about 50 to about 98 wt. % of said polymers, copolymers or said blend of polymers or copolymers, and from about 1 to about 20 wt. % of said photoacid generator.

6. The hybrid photo-patternable dielectric composition of claim 5 further comprising from about 0 to about 50 wt. % of a cross-linking component.

7. The hybrid photo-patternable dielectric composition of claim 1 wherein said one or more acid sensitive negative-tone functional groups are selected from linear or branched alkyls which are substituted with OH, C(O)OH, and/or F, cycloalkyls which are substituted with OH, C(O)OH, and/or F, aromatics which are substituted with OH, C(O)OH, and/or F, arenes that are substituted with OH, C(O)OH, and/or F, and acrylics which are substituted with OH, C(O)OH, and/or F.

8. The hybrid photo-patternable dielectric composition of claim 1 wherein said one or more acid sensitive positive-tone functional groups are selected from carbonyls, esters, ethers, acetals, ketals and aliphatic silylethers.

9. The hybrid photo-patternable dielectric composition of claim 1 wherein said solvent is ethoxyethylpropionate (EEP), a combination of EEP and γ-butyrolactone, propylene-glycol monomethylether alcohol and acetate, propyleneglycol monopropyl alcohol and acetate, and ethyl lactate, n-pentanol, or 4-methyl-2-pentanol.

10. A hybrid photo-patternable dielectric composition comprising:
at least one chemically amplified positive-tone resist;
a blend of a photoacid generator and a photobase generator; and
a solvent, wherein said dielectric composition has a dual-tone property with a dissolution response to an irradiation that increases within a first exposure dose range, reaches a maximum within a second exposure dose range, and decreases within a third exposure dose range.

11. The hybrid photo-patternable dielectric composition of claim 10 wherein said at least one chemically amplified positive-tone resist includes at least one positive-tone polymer, positive-tone copolymer, or a blend of positive-tone polymers and/or positive-tone copolymers having one or more acid sensitive positive-tone functional groups.

12. The hybrid photo-patternable dielectric composition of claim 11 wherein said positive-tone polymers include one monomer and said positive-tone copolymers include at least two monomers and wherein the monomers of the polymers and the monomers of the copolymers are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

13. The hybrid photo-patternable dielectric composition of claim 10 comprising on a solids basis from about 50 to about 98 wt. % of a polymer or a copolymer or a blend of polymers or copolymers, and from about 1 to about 20 wt. % said blend of photoacid generator and photobase generator.

14. The hybrid photo-patternable dielectric composition of claim 13 further comprising from about 0 to about 50 wt. % of a cross-linking component.

15. A hybrid photo-patternable dielectric composition comprising:
at least one chemically amplified negative-tone resist;
a blend of a photoacid generator and a photobase generator; and
a solvent, wherein said dielectric composition has a dual-tone property with a parabola like dissolution response to an irradiation that increases within a first exposure dose range, reaches a maximum within a second exposure dose range, and decreases within a third exposure dose range.

16. The hybrid photo-patternable dielectric composition of claim 15 further comprising at least one porogen.

17. The hybrid photo-patternable dielectric composition of claim 1 further comprising at least one porogen.

18. The hybrid photo-patternable dielectric composition of claim 15 wherein said at least one chemically amplified negative-tone resist includes at least one negative-tone polymer, negative-tone copolymer, or a blend of negative-tone polymers and/or negative-tone copolymers having one or more acid sensitive negative-tone functional groups.

19. The hybrid photo-patternable dielectric composition of claim 18 wherein said negative-tone polymers include one monomer and said negative-tone copolymers include at least two monomers and wherein the monomers of the polymers and the monomers of the copolymers are organo metallic compounds selected from an organo germanium compound, an organo hafnium compound, an organo aluminum compound, an organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated organo hafnium compound, a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

* * * * *